(12) United States Patent
Sharifi Tehrani

(10) Patent No.: US 11,467,897 B1
(45) Date of Patent: Oct. 11, 2022

(54) ADAPTIVE DATA INTEGRITY SCAN FREQUENCY

(71) Applicant: Micron Technology, Inc., Boise, ID (US)

(72) Inventor: Saeed Sharifi Tehrani, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/397,745

(22) Filed: Aug. 9, 2021

(51) Int. Cl.
*G06F 16/23* (2019.01)
*G06F 11/07* (2006.01)

(52) U.S. Cl.
CPC .......... *G06F 11/079* (2013.01); *G06F 11/073* (2013.01); *G06F 11/0751* (2013.01); *G06F 16/2365* (2019.01)

(58) Field of Classification Search
CPC .. G06F 16/2365; G06F 11/079; G06F 11/073; G06F 11/0751
See application file for complete search history.

(56) References Cited

U.S. PATENT DOCUMENTS

| 2016/0042024 A1* | 2/2016 | Campanotti ........ G06F 16/2365 707/694 |
| 2017/0031969 A1* | 2/2017 | Smits .................. G06F 16/2365 |

\* cited by examiner

*Primary Examiner* — Jonathan D Gibson
(74) *Attorney, Agent, or Firm* — Nicholson De Vos Webster & Elliott LLP

(57) ABSTRACT

Exemplary methods, apparatuses, and systems include detecting a trigger to update a data integrity scan frequency. In response to detecting the trigger, an age indicator for a subdivision of memory or a utilization value for the subdivision of memory are obtained. A new data integrity scan frequency is determined using the age indicator or the utilization value. A scan of the subdivision of memory is initiated during a current media scan loop using the new data integrity scan frequency.

20 Claims, 5 Drawing Sheets

ADAPTIVE DATA INTEGRITY SCAN FREQUENCY

TECHNICAL FIELD

The present disclosure generally relates to the mitigation of data errors in a memory subsystem, and more specifically, relates to determining and using an adaptive data integrity scan frequency to guarantee reliability of the memory subsystem.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
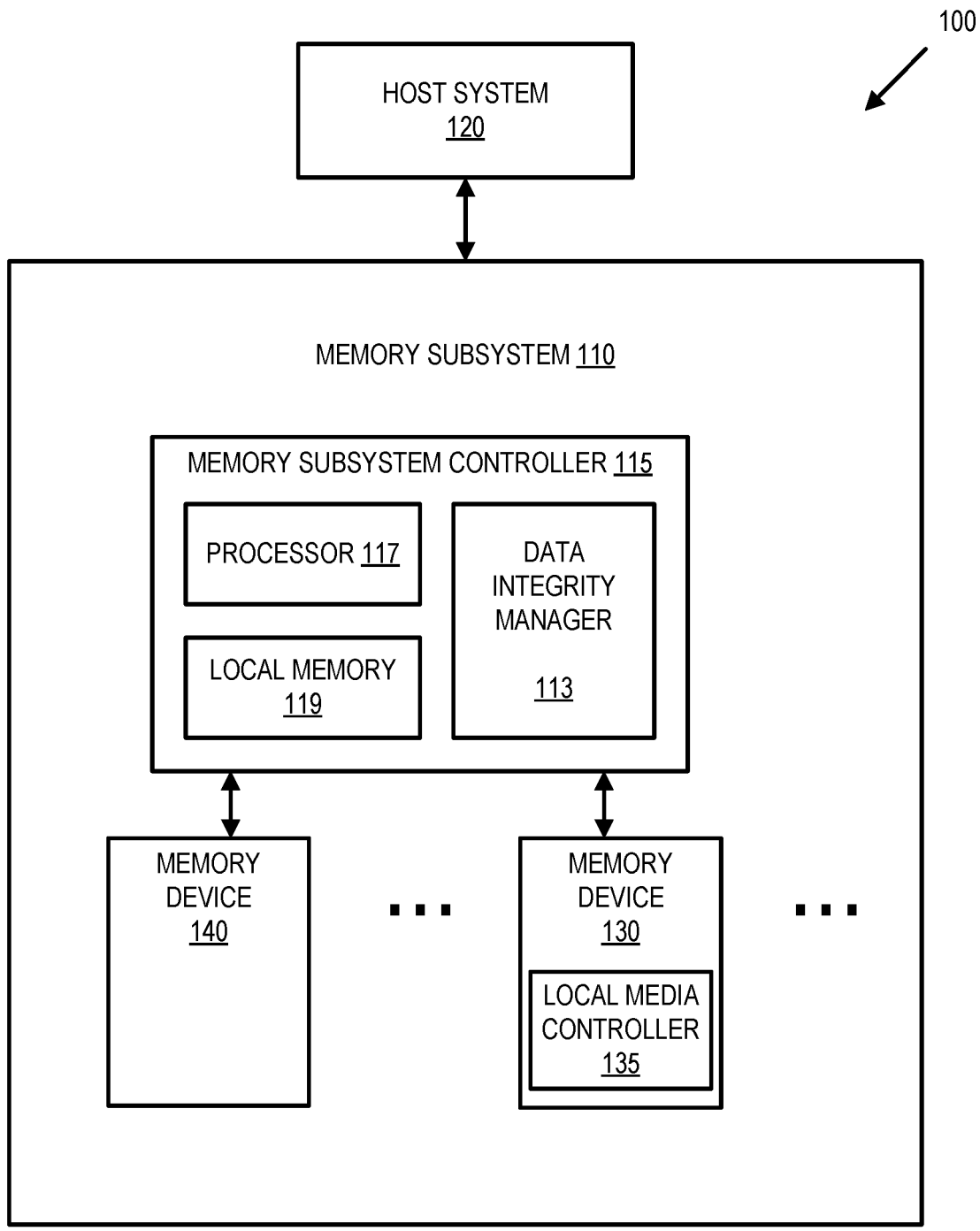
FIG. 1 illustrates an example computing system that includes a memory subsystem in accordance with some embodiments of the present disclosure.

Aspects of the present disclosure are directed to implementing an adaptive data integrity scan frequency in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Data reliability in a memory can degrade as the memory device increases in density. For example, error rates increase as device components scale down in size or when multiple/additional bits are programmed per cell, etc. One contributor to this reduction in reliability is read disturb. Read disturb occurs when a read operation performed on one portion of the memory (e.g., a row of cells), often referred to as the aggressor, impacts the threshold voltages in another portion of memory (e.g., a neighboring row of cells), often referred to as the victim. Memory devices typically have a finite tolerance for these disturbances. A sufficient amount of read disturb effects, such as a threshold number of read operations performed on neighboring aggressor cells, can change the victim cells in the other/unread portion of memory to different logical states than originally programmed, which results in errors. Additionally, other factors can contribute to errors. For example, data retention/the age of the stored data, hot-electron (hot-e) phenomenon (where reads within a block can increase the overall error rate observed in the block over time), cross-temperature differences between writing and reading, etc. can also contribute to bit errors.

A memory system can mitigate errors via an internal process of reading the memory (i.e., performing a media or integrity scan) and reprogramming one or more locations within subdivision of memory when, e.g., an indication of error(s) for the memory location(s) reaches a threshold value. Data integrity scans utilize time-based metrics with regard to the phenomena that result in errors and perform scans at a rate based on the worst-case scenario levels of reliability for said phenomena. For example, if a memory subsystem is full and nearing end of life (i.e., the maximum supported program/erase cycles (PEC) for the memory devices), it may have a specification that states that data can be stored in memory for X days without being reprogrammed After X days, the memory subsystem risks there being an uncorrectable number of errors in the data. The memory subsystem can utilize a data integrity scan frequency such that the memory subsystem can scan the entire drive (i.e., the frequency of read operations within a media scan loop based on an assumption that the memory device(s) are 100% fully programmed) within that number of days. The end-of-life metrics for a memory device, however, are much stricter than middle-of-life or beginning-of-life metrics. Additionally, when the utilization of memory is less than 100% (i.e., the memory device(s) are not 100% fully programmed), a scan frequency based on 100% utilization results in a scan loop that completes prior to the end of the time interval and the data integrity scan process pauses until the next time interval. As a result of using these worst-case metrics, a memory subsystem utilizes an unnecessarily high data integrity scan rate, at least at the beginning of each interval, during most of the lifetime of the memory devices. An unnecessarily high data integrity scan rate can result in delaying memory access by a host device.

Aspects of the present disclosure address the above and other deficiencies by dynamically selecting the data integrity scan frequency based upon the age, endurance, and/or utilization of the memory. For example, the memory subsystem can select data integrity scan frequency based on a current age of a memory device (e.g., in terms of PEC) and utilization of the memory device. As a result, the memory subsystem can greatly reduce the frequency of data integrity scans (e.g., during the beginning and middle of life of the memory device and/or when the memory device is not fully utilized). This further results in increased bandwidth for the host to access the memory without sacrificing reliability of the stored data.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded)

logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that mitigates read disturb and other data errors by regularly performing data integrity scans of the memory devices 130. In some embodiments, the controller 115 includes at least a portion of the data integrity manager 113. For example, the controller 115 can include a processor 117 (processing device) configured to execute instructions stored in local memory 119 for performing the operations described herein. In some embodiments, a data integrity manager 113 is part of the host system 120, an application, or an operating system.

The data integrity manager 113 performs data integrity scans at varying frequencies. The data integrity manager 113 can dynamically select the data integrity scan frequency based upon the age, endurance, and/or utilization of the memory. For example, the data integrity manager 113 can select data integrity scan frequency based on a current age of a memory device (e.g., in terms of PEC) and utilization of the memory device. Further details with regards to the operations of the data integrity manager 113 are described below.

Figure 2:
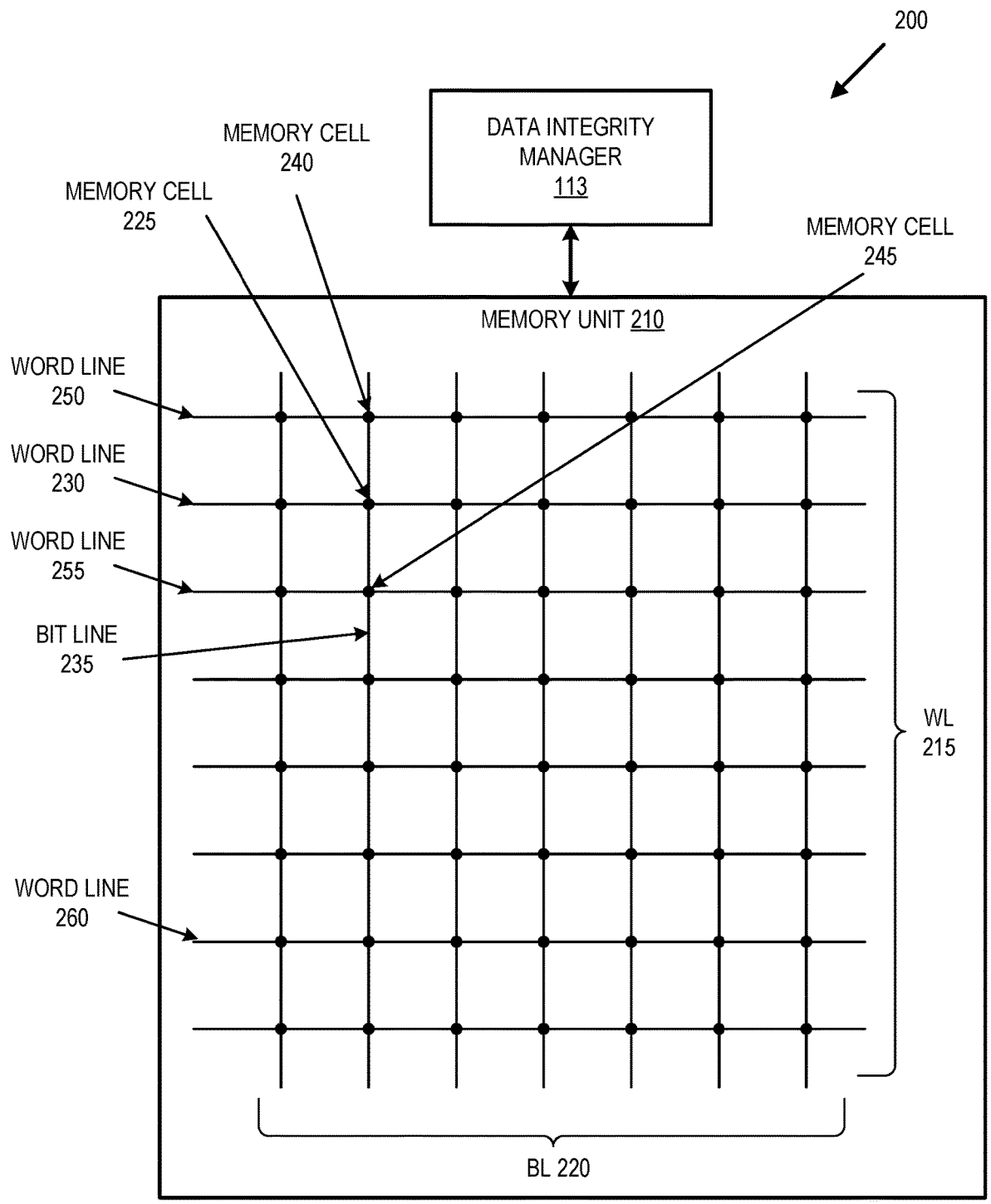
FIG. 2 illustrates an example of managing a portion of a memory subsystem in accordance with some embodiments of the present disclosure.

FIG. 2 illustrates an example of managing a portion of a memory subsystem 200 in accordance with some embodiments of the present disclosure. In one embodiment, the data integrity manager 113 implements a data integrity management scheme per memory unit 210. For example, the data integrity manager 113 can dynamically select a data integrity scan frequency per LUN or other subdivision of memory (i.e., memory unit 210).

The illustration of the memory unit 210 includes an array of memory cells. The memory 210 illustrates a small number of memory cells for the sake of providing a simple explanation. Embodiments of the memory unit 210 can include far greater numbers of memory cells.

Each memory unit 210 includes memory cells that the memory subsystem 110 accesses via word lines 215 and bit lines 220. For example, a memory device 130 can read a page of memory using word line 230. Within that page, memory cell 225 is accessed via word line 230 and bit line 235. As mentioned above, reading a memory cell can result in read disturb effects on other memory cells. For example, a read of memory cell 225 (the aggressor) can result disturbing memory cells 240 and 245 (the victims). Similarly, a read of other memory cells of word line 230 (the aggressor) can result in disturbing other memory cells of word lines 250 and 255 (the victims).

This disturb effect can increase the error rate for victim memory cells. In one embodiment, the data integrity manager 113 uses a data integrity scan to measure the error rate of a portion of memory as a raw bit error rate (RBER). In another embodiment, the data integrity manager 113 can use other measurements to represent an error rate or data reliability, such as voltage distribution values (e.g., a read threshold voltage distribution). In one embodiment, the data integrity manager 113 compares current, recent, or average voltage distribution values to ideal or expected voltage distribution values (e.g., values that result from a new or stress-free memory) and the magnitude of difference represents the error rate or other indication of data reliability.

The data integrity manager 113 can mitigate read disturb and other factors that contribute to data errors by checking the error rate of victim(s) during data integrity scans. In response to detecting an error rate of a given portion of memory satisfying a threshold error rate value, the data integrity manager 113 can migrate data from that portion of memory to different portion of memory. In one embodiment, the data integrity manager 113 utilizes the age, endurance, and/or utilization of the memory unit 210 to select a data integrity scan frequency. This and other features of the adaptive data integrity scan frequency scheme are described further with reference to FIGS. 3-4.

Figure 3:
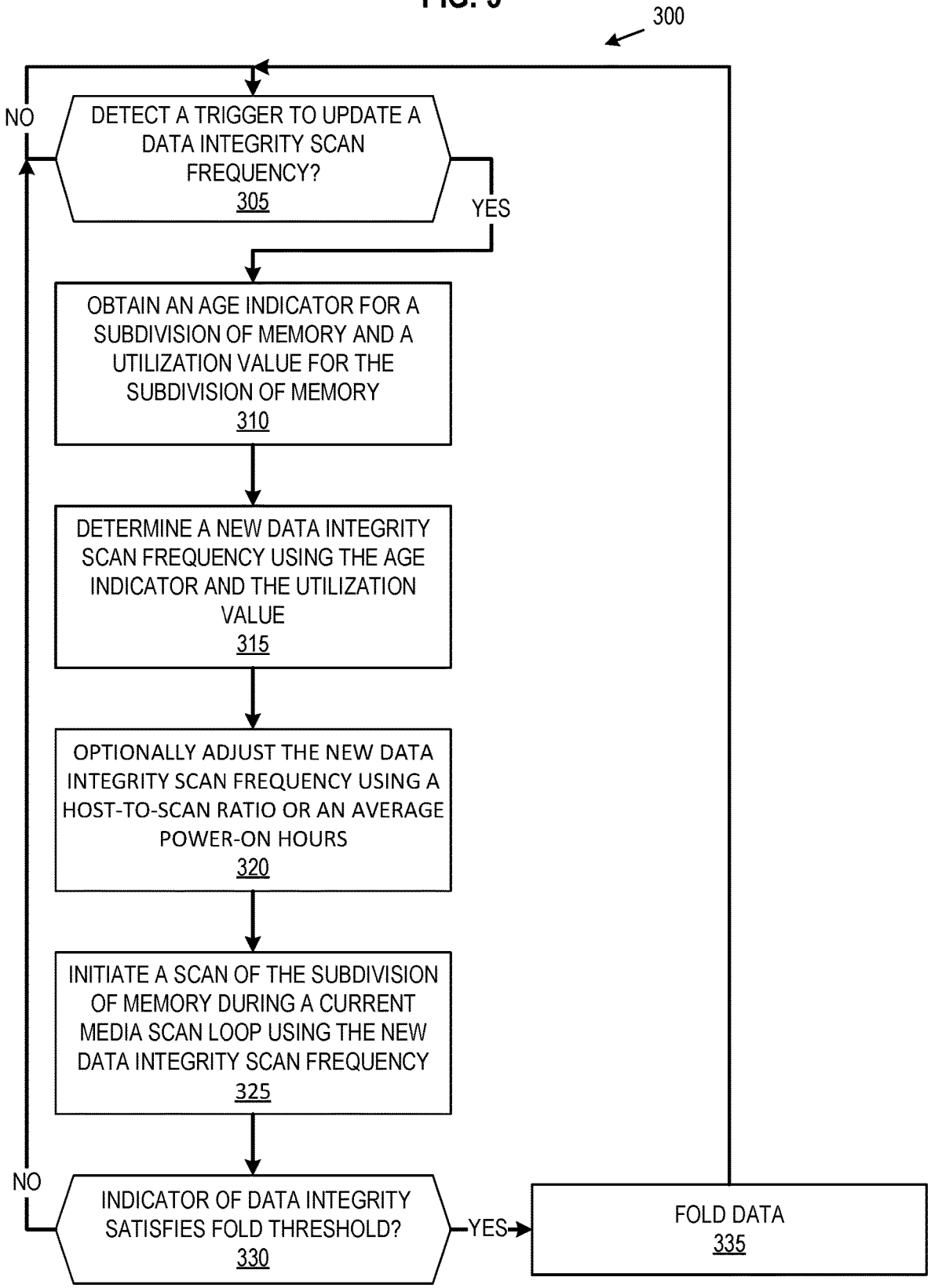
FIG. 3 is a flow diagram of an example method to dynamically select a data integrity scan frequency based upon the age, endurance, or utilization of the memory in accordance with some embodiments of the present disclosure.

FIG. 3 is a flow diagram of an example method 300 to dynamically select a data integrity scan frequency based upon the age, endurance, and/or utilization of the memory in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device detects whether a trigger to update a data integrity scan frequency has occurred for a subdivision of memory. For example, the processing device can use an amount of time passed following the last update or a power on event, the beginning or end of a media scan loop, or another parameter as the trigger. In one embodiment, the processing device detects a trigger to update the data integrity scan frequency for multiple subdivisions of memory. If the processing device does not detect a trigger, the method 300 returns to operation 305 to continue waiting to detect a trigger. If the processing device detects a trigger, the method 300 proceeds to operation 310.

At operation 310, the processing device obtains an age indicator for the subdivision of memory and a utilization value for the subdivision of memory. For example, the memory subsystem can track a number of PEC performed by a subdivision of memory and use the number of PEC as an indicator of age. Additionally or alternatively, the memory subsystem can use an amount of time the subdivision of memory has be in use, an average error rate or similar indicator of loss in data integrity, or another indication of age and/or endurance of the subdivision of memory.

The memory subsystem can also track an amount of utilization of the subdivision of memory, e.g., based upon an amount of memory in use for storing valid data as compared to an amount of memory that is not storing valid data (e.g., erased memory locations, memory locations flagged to be erased, etc.). For example, the amount of utilization can be tracked as a percentage or value between zero and one. In one embodiment, the processing device updates the utilization value by rounding the utilization value up to a nearest increment in a predetermined number of increments between zero and one. For example, the processing device can utilize increments of utilization to reduce the frequency that changes in utilization result in updating the data integrity scan frequency. In one embodiment, the processing device tracks utilization per subdivision of memory. In another embodiment, the processing device tracks utilization across all memory devices. In another embodiment, the processing device tracks utilization per block type (e.g., SLC, TLC, etc.).

At operation 315, the processing device determines a new data integrity scan frequency using the age indicator and the utilization value. For example, the processing device can obtain an amount of time data is estimated to be reliable for the age indicator. The processing device can determine a time interval (between scans) for the subdivision of memory when fully utilized by dividing the amount of time of data reliability for the age indicator by a number of pages of memory (i.e., the number of pages per block or similar units of memory is a predetermined number for the memory subsystem) in the subdivision of memory:

$$\text{Time interval} \sim \frac{\text{Time of data reliability at current } PEC}{\text{Units of memory to be scanned in fully-written subdivision of memory}}$$

There is an inverse relationship between the time interval and the scan frequency (e.g., a smaller interval corresponds to a higher frequency). In one embodiment, the time of data reliability at the current PEC represents the worst-case time among various contributors to error rates (e.g., read disturb, hot-e, data retention, etc.).

The processing device makes a utilization adjustment by dividing the time interval for the subdivision of memory when fully utilized by the utilization value. For example, if the time interval determined as described above (which assumes drive is full), resulted in a data integrity scan every 8 sec and utilization value is 0.5, the time interval is adjusted to 8/0.5=16 sec. This adjusted time interval can be determined and used based on/for a single subdivision of memory, multiple subdivisions of memory, or all subdivisions of memory.

At operation 320, the processing device optionally adjusts the new data integrity scan frequency using/considering block type, an acceptable host-to-scan ratio in the system and/or the average/typical power-on hours per day. For example, the processing device manage different scan frequencies for SLC blocks, TLC blocks, etc. As another example, the host-to-scan ratio indicates how many scan reads can happen in the memory subsystem between host reads. A ratio of 10:1 means that in every ten host reads, one scan read can be issued. When calculating the time interval, the processing device can avoid violating the ratio so as to prevent a drop in memory performance. As another example, the calculation of the time interval can be based upon an assumption that the memory subsystem a is on 24 hours per day. If, however, the memory subsystem is on for only 12 hours per day (on average), the processing device can consider this as a factor in calculating the time interval and, e.g., double scan frequency to meet the time of data reliability at current PEC.

At operation 325, the processing device initiates a data integrity scan of the subdivision of memory during a current media scan loop using the new data integrity scan frequency. For example, the processing device sets the data integrity scan frequency to the adjusted time interval. At the new data integrity scan frequency, the processing device executes one or more reads to determine an indicator of data integrity of each memory location read as a part of the data integrity scan. In one embodiment, this includes checking the error rate, such as a raw bit error rate (RBER), for the memory location(s). In another embodiment, determining an indicator of data integrity includes comparing the threshold voltage distribution of the victim/sampled portion of memory with an expected voltage distribution.

In an embodiment in which threshold voltage distributions are used as indicators of data reliability, the processing device can compare the "shape" of measured distribution values/histogram against a fold threshold by determining if the shape is monotonically increasing/decreasing, compare local minima, comparing the width of histograms, determining an amount of shift (left/right) of histograms, etc. As another example, the processing device can compare the "population" of threshold voltage distributions/histograms or portions thereof (e.g., between certain read positions). A recent histogram population that satisfies a threshold increase from an ideal population between read positions can serve as an indication of data reliability (or lack thereof).

At operation 330, the processing device determines if the indicator of data integrity of any memory locations satisfies a fold threshold. For example, if the error rate of a memory location satisfies a fold threshold (e.g., meets or exceeds an error rate threshold value), the method 300 proceeds to operation 335 and the processing device folds the data. The processing device can fold the data by error correcting the data of the memory location and writes the corrected data to a new location. If the indicator of data integrity of the memory locations do not satisfy a fold threshold, or after folding data for locations that do satisfy the fold threshold, the method 300 returns to operation 305 to wait to detect the next trigger.

Figure 4:
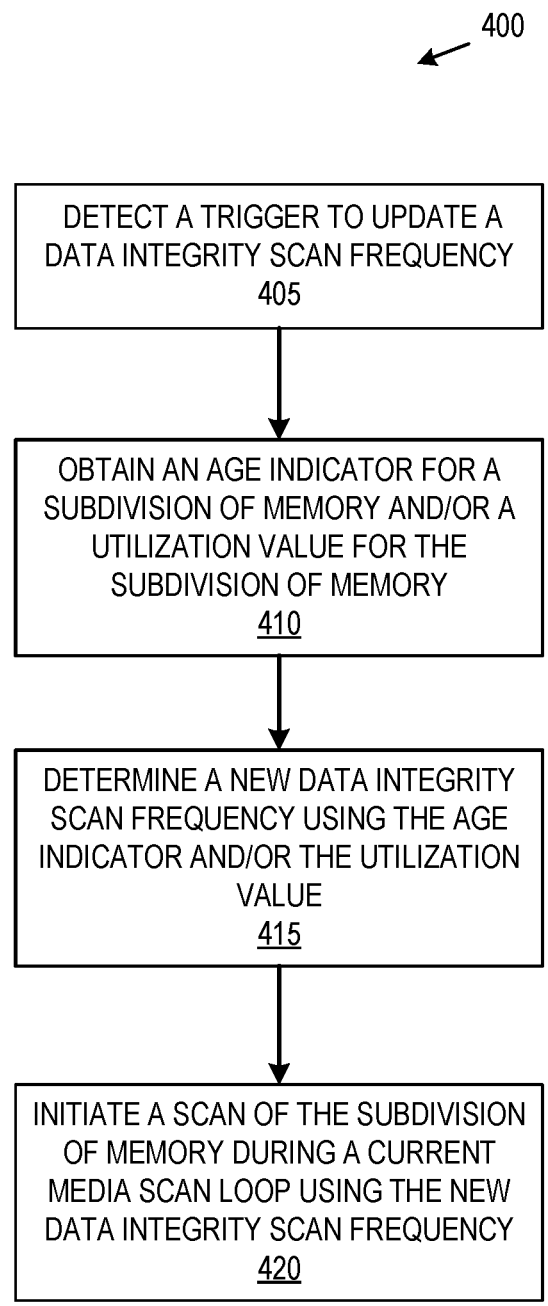
FIG. 4 is flow diagram of another example method to dynamically select a data integrity scan frequency based upon the age, endurance, or utilization of the memory in accordance with some embodiments of the present disclosure.

FIG. 4 is flow diagram of another example method to dynamically select a data integrity scan frequency based upon the age, endurance, and/or utilization of the memory in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device detects whether a trigger to update a data integrity scan frequency has occurred for a subdivision of memory. For example, the processing device can use an amount of time passed following the last update or a power on event, the beginning or end of a data integrity scan loop, or another parameter as the trigger as described above with reference to operation 305.

At operation 410, the processing device obtains an age indicator for the subdivision of memory and/or a utilization value for the subdivision of memory. For example, the memory subsystem can use the number of PEC, an amount of time the subdivision of memory has be in use, an average error rate or similar indicator of loss in data integrity, a combination of one or more of these indications, or another indication of age and/or endurance of the subdivision of memory as described above with reference to operation 310.

At operation 415, the processing device determines a new data integrity scan frequency using the age indicator and/or the utilization value. For example, the processing device can determine a time interval using an age indication as described above with reference to operation 315. Optionally, the processing device can adjust the time interval using the utilization value as described above with reference to operation 315 and, optionally, operation 320. Alternatively, the processing device can use a default time interval (e.g., based on a worst-case/regardless of a current age indicator) and adjust the default time interval using the utilization value as described above with reference to operation 315 and, optionally, operation 320.

At operation 420, the processing device initiates a data integrity scan of the subdivision of memory during a current media scan loop using the new data integrity scan frequency. For example, the processing device sets the data integrity scan frequency to the adjusted time interval as described above with reference to operation 325.

Figure 5:
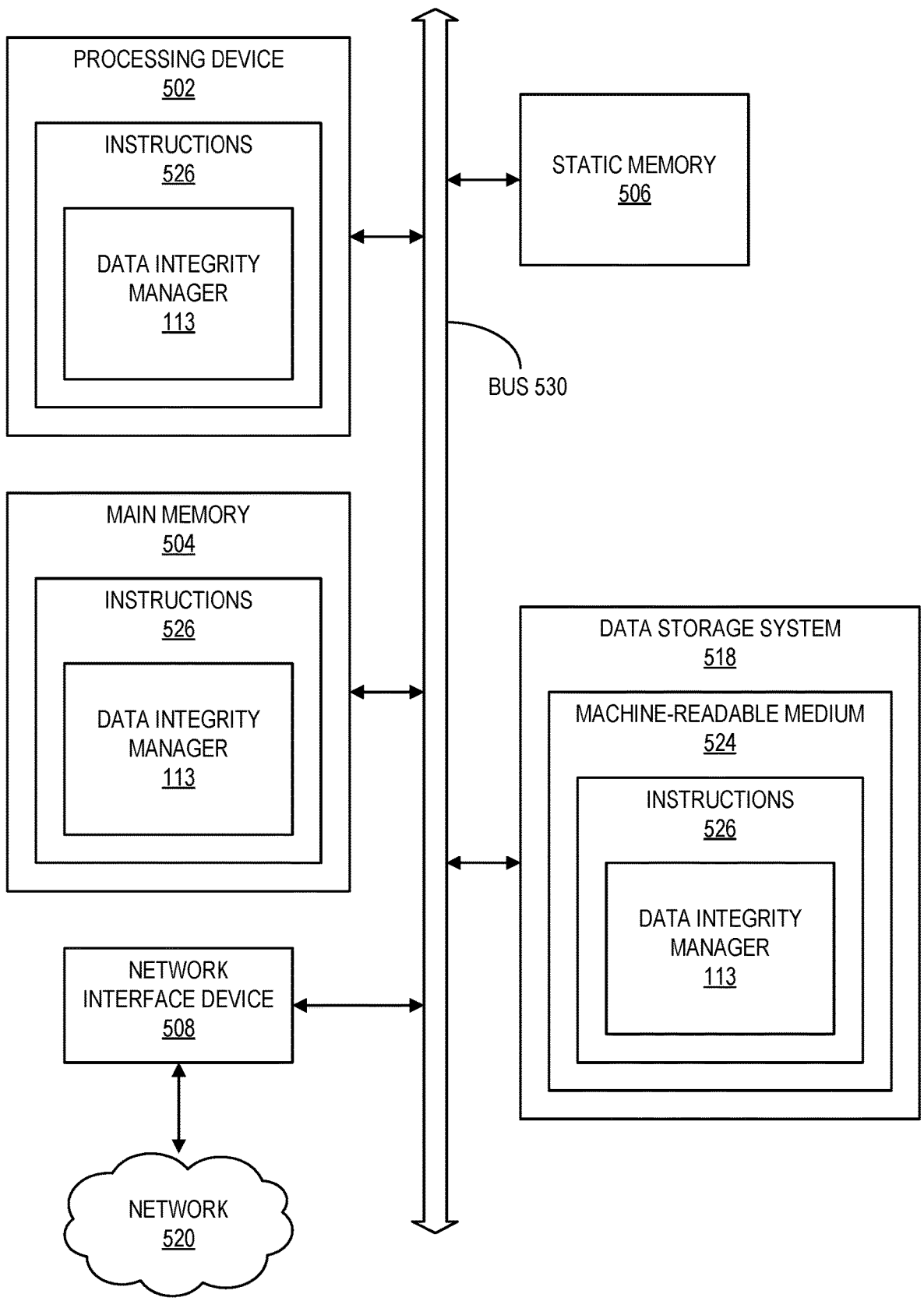
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a data integrity manager (e.g., the data integrity manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300-400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   detecting a trigger to update a data integrity scan frequency;
   in response to detecting the trigger, obtaining an age indicator for a subdivision of memory or a utilization value for the subdivision of memory;
   determining a new data integrity scan frequency using the age indicator or the utilization value; and
   initiating a scan of the subdivision of memory during a current media scan loop using the new data integrity scan frequency.

2. The method of claim 1, wherein the trigger is an end of a previous media scan loop or a beginning of the current media scan loop.

3. The method of claim 1, wherein the age indicator is a number of program/erase cycles performed by the subdivision of memory.

4. The method of claim 1, wherein the utilization value is a number between zero and one that represents a percentage of the subdivision of memory that is currently programmed with valid data.

5. The method of claim 4, further comprising:
   updating the utilization value by rounding the utilization value up to a nearest increment in a predetermined number of increments between zero and one.

6. The method of claim 1, wherein determining the new data integrity scan frequency comprises:
obtaining an amount of time of data reliability for the age indicator;
determining a time interval for the subdivision of memory when fully utilized by dividing the amount of time of data reliability for the age indicator by a number of pages of memory in the subdivision of memory; and
dividing the time interval for the subdivision of memory when fully utilized by the utilization value.

7. The method of claim 6, further comprising:
adjusting the time interval for the subdivision of memory using a host-to-scan read ratio or an average power-on hours per day.

8. A non-transitory computer-readable storage medium comprising instructions that, when executed by a processing device, cause the processing device to:
detect a trigger to update a data integrity scan frequency;
in response to detecting the trigger, obtain an age indicator for a subdivision of memory or a utilization value for the subdivision of memory;
determine a new data integrity scan frequency using the age indicator or the utilization value; and
initiate a scan of the subdivision of memory during a current media scan loop using the new data integrity scan frequency.

9. The non-transitory computer-readable storage medium of claim 8, wherein the trigger is an end of a previous media scan loop or a beginning of the current media scan loop.

10. The non-transitory computer-readable storage medium of claim 8, wherein the age indicator is a number of program/erase cycles performed by the subdivision of memory.

11. The non-transitory computer-readable storage medium of claim 8, wherein the utilization value is a number between zero and one that represents a percentage of the subdivision of memory that is currently programmed with valid data.

12. The non-transitory computer-readable storage medium of claim 11, wherein the processing device is further to:
update the utilization value by rounding the utilization value up to a nearest increment in a predetermined number of increments between zero and one.

13. The non-transitory computer-readable storage medium of claim 8, wherein determining the new data integrity scan frequency comprises:
obtaining an amount of time of data reliability for the age indicator;
determining a time interval for the subdivision of memory when fully utilized by dividing the amount of time of data reliability for the age indicator by a number of pages of memory in the subdivision of memory; and
dividing the time interval for the subdivision of memory when fully utilized by the utilization value.

14. The non-transitory computer-readable storage medium of claim 13, wherein the processing device is further to:
adjust for the subdivision of memory using a host-to-scan read ratio or an average power-on hours per day.

15. A system comprising:
a plurality of memory devices; and
a processing device, operatively coupled with the plurality of memory devices, to:
detect a trigger to update a data integrity scan frequency;
in response to detecting the trigger, obtain a number of program/erase cycles performed by a subdivision of memory or a utilization value for the subdivision of memory;
determine a new data integrity scan frequency using the number of program/erase cycles or the utilization value; and
initiate a scan of the subdivision of memory during a current media scan loop using the new data integrity scan frequency.

16. The system of claim 15, wherein the trigger is an end of a previous media scan loop or a beginning of the current media scan loop.

17. The system of claim 15, wherein the utilization value is a number between zero and one that represents a percentage of the subdivision of memory that is currently programmed with valid data.

18. The system of claim 17, wherein the processing device is further to:
update the utilization value by rounding the utilization value up to a nearest increment in a predetermined number of increments between zero and one.

19. The system of claim 15, wherein determining the new data integrity scan frequency comprises:
obtaining an amount of time of data reliability for the number of program/erase cycles;
determining a time interval for the subdivision of memory when fully utilized by dividing the amount of time of data reliability for the number of program/erase cycles by a number of pages of memory in the subdivision of memory; and
dividing the time interval for the subdivision of memory when fully utilized by the utilization value.

20. The system of claim 19, wherein the processing device is further to:
adjust the time interval for the subdivision of memory using a host-to-scan read ratio or an average power-on hours per day.

* * * * *